(12) United States Patent
Stokes

(10) Patent No.: US 8,803,530 B2
(45) Date of Patent: Aug. 12, 2014

(54) ELECTRICAL FAULT LOCATION DETERMINATION

(75) Inventor: Martin Stokes, Bristol (GB)

(73) Assignee: Vetco Gray Controls Limited, Nailsea, Bristol (GB)

(*) Notice: Subject to any disclaimer, the term of this patent is extended or adjusted under 35 U.S.C. 154(b) by 528 days.

(21) Appl. No.: 13/110,566

(22) Filed: May 18, 2011

(65) Prior Publication Data

US 2011/0291661 A1   Dec. 1, 2011

(30) Foreign Application Priority Data

May 25, 2010 (GB) .................................. 1008680.9

(51) Int. Cl.
G01R 31/28 (2006.01)

(52) U.S. Cl.
USPC ........................................................ 324/528

(58) Field of Classification Search
USPC ........................... 324/528–533, 762.01–762.1
See application file for complete search history.

(56) References Cited

U.S. PATENT DOCUMENTS

| 6,509,740 B1* | 1/2003 | Needle et al. .................. 324/533 |
| 7,023,963 B1* | 4/2006 | Chu et al. .................... 379/15.05 |
| 2004/0100273 A1 | 5/2004 | Liney et al. |

FOREIGN PATENT DOCUMENTS

| EP | 0148674 A1 | 12/1984 |
| EP | 0460315 A1 | 6/1990 |
| GB | 2405479 A | 3/2005 |
| GB | 2463890 A | 3/2010 |
| JP | 57141567 A | 9/1982 |

OTHER PUBLICATIONS

Search Report, dated Jul. 2010.

* cited by examiner

Primary Examiner — Tung X Nguyen
(74) Attorney, Agent, or Firm — Global Patent Operation

(57) ABSTRACT

A method of determining the location of a fault in a cable at an underwater fluid extraction facility is provided. The method comprises: providing a time domain reflectometry unit at the facility, the unit being connected to at least one wire within the cable; causing the unit to transmit a current pulse to the wire; detecting a reflected pulse received at the unit; determining the time duration between the pulse transmission and the reflected pulse reception and using the duration to calculate a distance between the fault and the unit; and determining the location of a fault on the wire using the calculated distance.

17 Claims, 2 Drawing Sheets

US 8,803,530 B2

ELECTRICAL FAULT LOCATION DETERMINATION

FIELD OF INVENTION

This invention relates to a method of determining the location of a fault in a cable at an underwater fluid extraction facility, and an underwater fluid extraction facility.

BACKGROUND OF THE INVENTION

A breakdown in the insulation of an electrical cable, for example resulting in short-circuiting of a conductor and earth, can be a problem in any environment. Often, it is not sufficient simply to identify that such a fault has occurred, but also to determine the location of the fault. There are various techniques and devices available to do this. However, the problems are exacerbated when the cable is used in a remote or difficult to access location, where the use of such techniques or devices may not be easily practicable. Underwater fluid extraction facilities, for example subsea hydrocarbon extraction facilities, are examples of such remote locations.

Currently, the line isolation of subsea cables is measured to look for a breakdown of insulation to determine if a fault has occurred. With this information long term trends can be observed. This technique however does not provide information on the location of the fault on the cable. As mentioned above, at topside/surface parts of the facility this isn't a major problem, as commercial "off the shelf" cable fault detectors can be used. But for distributed systems e.g. involving communication electronics modules (CEMs) or power and communication distribution modules (PCDMs) etc, there is no easy way of knowing where the fault is on the subsea cable.

It is an aim of the present invention to overcome these problems and provide the location of insulation-breakdown faults on underwater cables simply and robustly.

This aim is achieved by the use of time domain reflectometry to locate the position of faults on a cable.

The present invention has particular application to umbilical cables connected to a distributed system of an underwater fluid extraction facility.

The invention would provide various advantages, for example it would enable an oil company to find precisely where a cable fault lies, so that they could then make an informed judgement on how to proceed, e.g. they could decide to investigate what caused the fault, such as fishing equipment, corrosion etc.

SUMMARY OF THE INVENTION

In accordance with a first aspect of the present invention there is provided a method of determining the location of a fault in a cable at an underwater fluid extraction facility, comprising the steps of:
a) providing a time domain reflectometry unit at the facility, the unit being connected to at least one wire within the cable;
b) causing the unit to transmit a current pulse to the wire;
c) detecting a reflected pulse received at the unit;
d) determining the time duration between the pulse transmission and the reflected pulse reception and using the duration to calculate a distance between the fault and the unit; and
e) determining the location of a fault on the wire using the calculated distance.

In accordance with a second aspect of the present invention there is provided an underwater fluid extraction facility comprising means for determining the location of a fault in a cable at the facility, the fault location determination means comprising a time domain reflectometry unit, the unit being connected to at least one wire within the cable.

BRIEF DESCRIPTION OF THE DRAWINGS

The invention will now be described with reference to the accompanying drawings, in which.

DETAILED DESCRIPTION OF THE INVENTION

Figure 1:
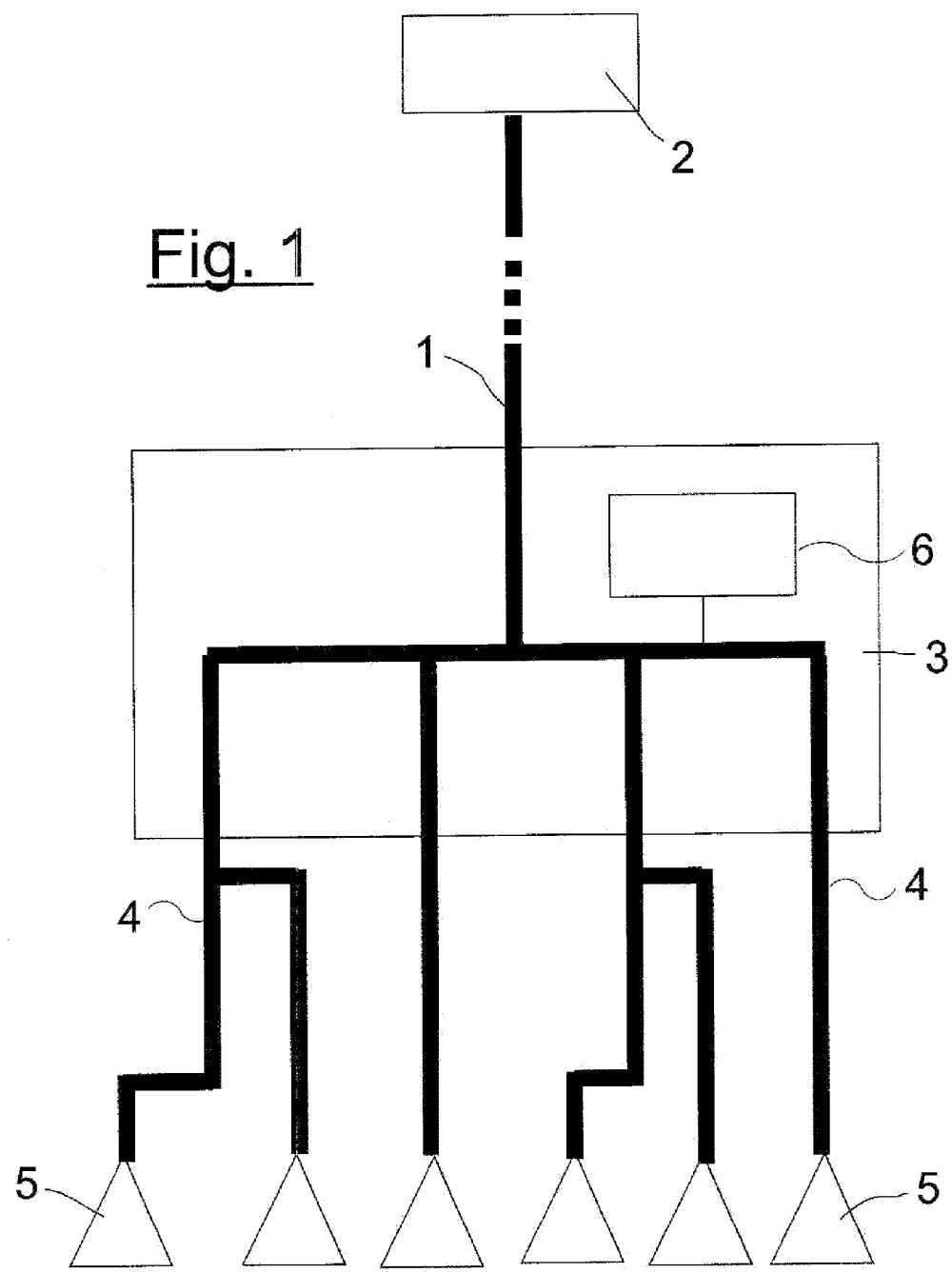
FIG. 1 schematically shows a distribution system for a subsea fluid extraction facility in accordance with the present invention.

A first embodiment of the invention is schematically shown in FIG. 1. A main umbilical cable 1 connects a topside/surface location 2 with an underwater installation comprising a number of well trees 5 located on the seabed. At the seabed, the umbilical 1 enters a power and communication distribution module (PCDM) 3, where it is split into a number of subsidiary umbilical cables 4, each of which terminates at a respective well tree 5, thus providing a distributed system. In the simplest case each umbilical 4 carries a pair of wires to transmit power or communications to the trees 5. In more typical embodiments, the umbilical may carry a number of wire pairs carrying power and communications signals and providing back-ups to the power and communications signals. A time domain reflectometry module (TDRM) 6 is connected to wires of the distributed system, to detect the location of a line-to-earth insulation failure, as illustrated in more detail in FIG. 2.

Figure 2:
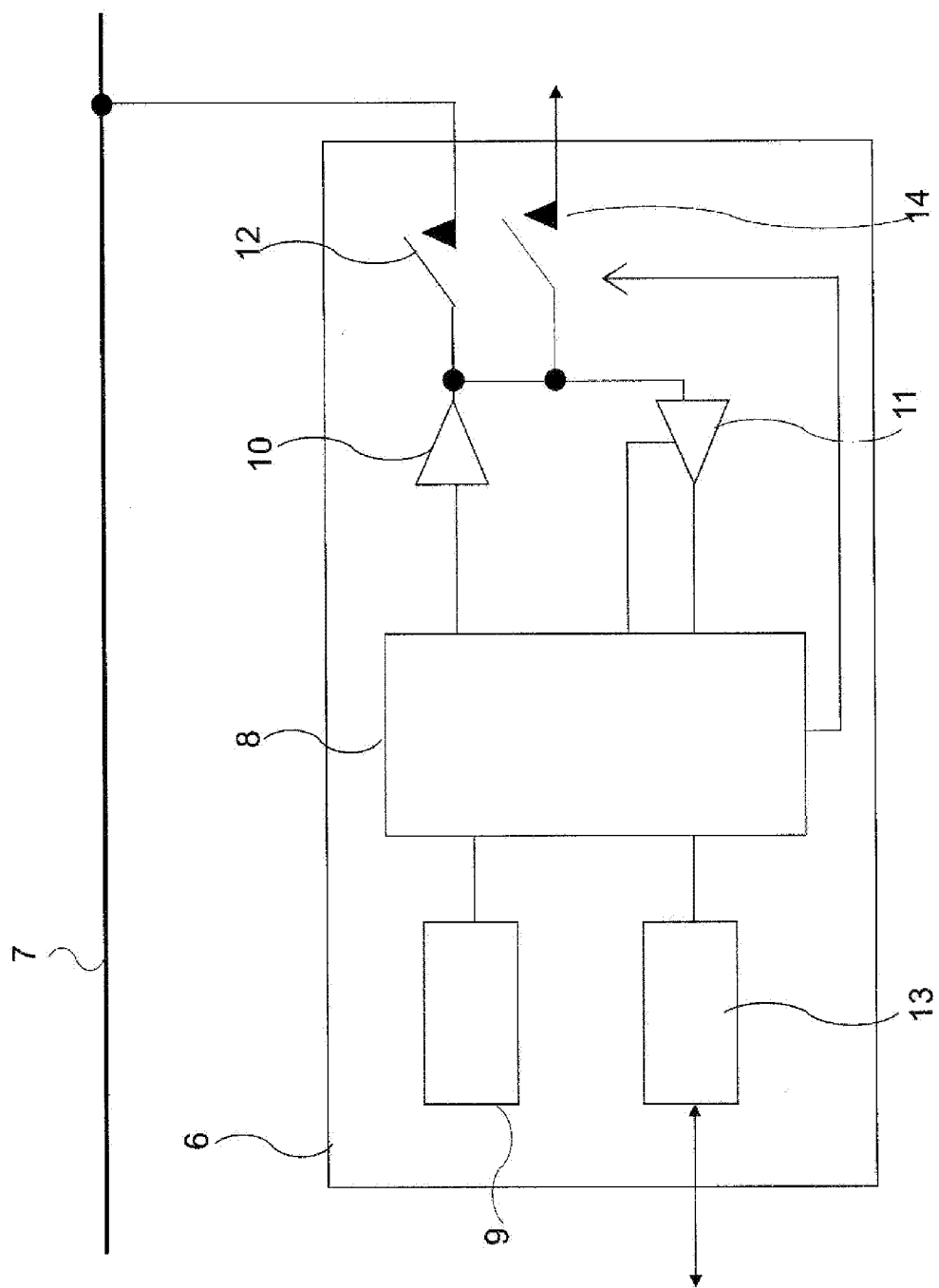
FIG. 2 schematically shows a more detailed view of the time domain reflectometry module of FIG. 1.

FIG. 2 shows the TDRM 6 connected to a wire 7 within an umbilical 4. The TDRM 6 comprises a microprocessor 8, which is supplied with electric power from an isolated (from earth) power supply 9. The microprocessor 8 is connected in communication with an isolated Ethernet link 13, which is arranged to communicate with external components. Typically, the link 13 will be arranged to communicate via a subsea electronic module (SEM - not shown) with the topside/surface location 2. The microprocessor 8 is connected to a drive (or "transmit") amplifier 10 and adapted to pass current thereto. Microprocessor 8 is also connected to a gated receive amplifier 11, with its gate being controlled by microprocessor 8, and adapted to receive signals therefrom. A number of isolator switches 12, 14 independently controlled by microprocessor 8 are provided, with each switch being connected between amplifiers 10, 11 and a different respective wire (in FIG. 2 for clarity only two such switches are shown).

A possible mode of operation is as follows:—when the location of an insulation failure on wire 7 is required, the microprocessor 8 is commanded, through the external Ethernet communication link 13 (for example upon request from the topside/surface location 2), to momentarily close the switch 12, and thus produce a very short current pulse. The pulse is applied between wire 7 of umbilical 4 and earth (typically a metal sheath of the umbilical) via the drive amplifier 10, whilst at the same time the receive amplifier 11 is gated off by microprocessor 8. Synchronously with the end of the pulse, the amplifier 11 is gated on by microprocessor 8. The pulse will propagate along wire 7 through the umbilical and its distribution system. If the pulse encounters an insulation failure, the pulse will be reflected from the fault location and travel back toward TDRM 6, where it is received by the receive amplifier 11, and fed to the microprocessor 8. This in turn may then measure the time duration Δt between the pulse transmission and reception of the reflected pulse, and use this time to calculate the distance from the pulse injection point to the fault, using a simple calculation:

$$x = v\Delta t/2$$

where v=the speed of travel of the pulse (which is known) and x=the distance from the pulse injection point to the fault.

This information is then sent to wherever it is required, for example the topside/surface location, via the Ethernet communication link 13.

It will be noted that the above process provides an accurate determination of the distance of the fault from the TDRM 6. However, in a distributed system this alone may not be sufficient to determine in which part of the system the fault is located. In order to more accurately determine the location of the fault, the performance of components, for example the subsea trees 5 (see FIG. 1), within the installation is checked, and components having impaired performance are identified. Since an insulation failure is likely to affect the performance of one of these trees 5, the exact part of the distribution system which has the fault can be identified. For example, suppose the TDRM 6 identifies that the fault is at a distance z meters away. A fault at this distance could affect a number of trees A, B and C. However, if the performance of trees A and C is not impaired, then it may be deduced by correlation of the distance determination and the impaired performance information that the fault lies at a distance z from TDRM 6 on the umbilical 4 linking to tree B. The performance may be checked by means located either at the topside/surface or at the installation.

Insulation to earth checks can be made on other wires in the umbilical by the addition of further switches 14 connected to different respective wires, and appropriate changes to the software in the microprocessor 8.

The above-described embodiments are exemplary only, and other possibilities and alternatives within the scope of the invention will be apparent to those skilled in the art. For example, the TDRM 6 could be located either in a housing of its own or alternatively be located at any other convenient location such as within a CEM, SEM or PCDM. Instead of utilising a dedicated power supply for the TDRM, power may be obtained from the umbilical, or from any other power source available at the installation.

What is claimed is:

1. A method of determining the location of a fault in a cable at an underwater fluid extraction facility, the method comprising:
   providing a time domain reflectometry unit at the facility, the unit being connected to at least one wire within the cable;
   causing the unit to transmit a current pulse to the wire;
   detecting a reflected pulse received at the unit;
   determining the time duration between the pulse transmission and the reflected pulse reception and using the duration to calculate a distance between the fault and the unit;
   determining the location of a fault on the wire using the calculated distance; and identifying components at the facility which have impaired performance.

2. The method according to claim 1, wherein determining the location of a fault comprises correlating the time duration information with the components with impaired performance to determine the fault location.

3. The method according to claim 1, wherein the unit communicates with external components via an Ethernet link.

4. The method according to claim 1, wherein the underwater fluid extraction facility comprises a subsea hydrocarbon extraction facility.

5. The method according to claim 2, wherein the unit communicates with external components via an Ethernet link.

6. The method according to claim 5, wherein the underwater fluid extraction facility comprises a subsea hydrocarbon extraction facility.

7. An underwater fluid extraction facility comprising means for determining the location of a fault in a cable at the facility, the fault location determination means comprising a time domain reflectometry unit, the unit being connected to at least one wire within the cable, and means for identifying components at the facility which have impaired performance.

8. The facility according to claim 7, wherein the fault location determination means comprises:
   means for causing the unit to transmit a current pulse to the wire;
   means for detecting a reflected pulse received at the unit;
   means for determining the time duration between the pulse transmission and the reflected pulse reception and using the duration to calculate a distance between the fault and the unit; and
   means for determining the location of a fault on the wire using the calculated distance.

9. The facility according to claim 7, wherein the unit is located within a module selected from the group consisting of a communications electronic module, a subsea electronics module and a power and communication distribution module.

10. The facility according to claim 7, wherein the unit comprises an Ethernet link for communication with external components.

11. The facility according to claim 7, wherein the underwater fluid extraction facility comprises a subsea hydrocarbon extraction facility.

12. The facility according to claim 8, wherein the unit is located within a module selected from the group consisting of a communications electronic module, a subsea electronics module and a power and communication distribution module.

13. The facility according to claim 8, wherein the unit comprises an Ethernet link for communication with external components.

14. The facility according to claim 12, wherein the unit comprises an Ethernet link for communication with external components.

15. The facility according to claim 8, wherein the underwater fluid extraction facility comprises a subsea hydrocarbon extraction facility.

16. The facility according to claim 12, wherein the underwater fluid extraction facility comprises a subsea hydrocarbon extraction facility.

17. The facility according to claim 13, wherein the underwater fluid extraction facility comprises a subsea hydrocarbon extraction facility.

* * * * *